(12) United States Patent
Murata et al.

(10) Patent No.: US 6,723,381 B1
(45) Date of Patent: Apr. 20, 2004

(54) METHOD AND APPARATUS FOR MANUFACTURING CERAMIC-BASED COMPOSITE MEMBER

(75) Inventors: Hiroshige Murata, Funabashi (JP); Muneyoshi Shioda, Tokyo (JP); Takeshi Nakamura, Tokorozawa (JP)

(73) Assignee: Ishikawajima-Harima Heavy Industries Co., Ltd., Tokyo (JP)

( * ) Notice: Subject to any disclaimer, the term of this patent is extended or adjusted under 35 U.S.C. 154(b) by 0 days.

(21) Appl. No.: 09/536,760

(22) Filed: Mar. 28, 2000

(30) Foreign Application Priority Data

Sep. 6, 1999 (JP) .......................................... 11-251410

(51) Int. Cl.$^7$ ........................... C23C 16/24; C23C 16/26
(52) U.S. Cl. ......................... 427/249.15; 427/249.16; 427/249.2; 427/249.4
(58) Field of Search ..................... 376/327; 428/293.4; 427/294, 372.2, 385.5, 900, 249.2, 255.11, 255.12, 249.1, 249.3, 249.4, 249.15, 249.16; 118/667, 408, 50, 694

(56) References Cited

U.S. PATENT DOCUMENTS

| | | | | |
|---|---|---|---|---|
| 3,850,136 A | * | 11/1974 | Ruzzo ............................ | 118/5 |
| 4,178,413 A | * | 12/1979 | DeMunda .................... | 428/408 |
| 5,204,380 A | * | 4/1993 | Seyferth et al. ............ | 522/148 |
| 5,221,355 A | * | 6/1993 | Ohashi et al. .............. | 118/725 |
| 5,632,320 A | * | 5/1997 | Atmur et al. ................. | 164/98 |
| 5,853,653 A | * | 12/1998 | Donato et al. .............. | 264/625 |
| 5,900,297 A | * | 5/1999 | Rudolph et al. ........... | 428/66.2 |
| 5,904,957 A | * | 5/1999 | Christin et al. .......... | 427/248.1 |
| 5,946,367 A | * | 8/1999 | Maruyama et al. ......... | 376/327 |
| 6,083,560 A | * | 7/2000 | Fisher et al. ............. | 427/249.2 |
| 6,217,997 B1 | * | 4/2001 | Suyama et al. .......... | 428/293.4 |
| 6,246,740 B1 | * | 6/2001 | Maruyama et al. ......... | 376/327 |
| 6,342,269 B1 | * | 1/2002 | Yoshida et al. ......... | 427/255.12 |
| 6,368,663 B1 | * | 4/2002 | Nakamura et al. ....... | 427/248.1 |

FOREIGN PATENT DOCUMENTS

| | | |
|---|---|---|
| EP | 0 172 082 A | 2/1986 |
| EP | 0 799 809 A | 10/1997 |
| EP | 1 024 121 A | 8/2000 |
| JP | 63 12671 | 1/1988 |
| JP | 01-190744 A | 7/1989 |
| WO | WO 94/15887 A | 7/1994 |
| WO | WO 97/06909 A | 7/1997 |

OTHER PUBLICATIONS

A. Blaga, J.J. Beaudoin. Canaian Building Digest; CBD–241 Polymer Modiefied Concrete. Oct. 1985. http://www.nrc.ca/irc/cbd/cbd241e.html.*

* cited by examiner

*Primary Examiner*—Timothy Meeks
*Assistant Examiner*—Eric B. Fuller
(74) *Attorney, Agent, or Firm*—Griffin & Szipl

(57) ABSTRACT

An organic silicon polymer is infiltrated and charged into gaps in a matrix phase of a formed fiber fabric, and its airtightness is increased by (a) CVI infiltration process 2 for forming the SIC matrix phase on the surface of the fiber fabric formed, (b) pressurized infiltrations process 4 for pressurizing the organic silicon polymer in the direction operating pressure is applied to the fiber fabric during use and infiltrating the organic silicon polymer into gaps in the aforementioned matrix phase, and (c) heating process 5 for heating the infiltrated fiber fabric at a high temperature. Thus, airtightness can be increased quickly, and fired work can be applied practically even to thrust chambers etc.

6 Claims, 4 Drawing Sheets

METHOD AND APPARATUS FOR MANUFACTURING CERAMIC-BASED COMPOSITE MEMBER

This application claims priority on Japanese Patent Application Number 251410/1999, filed Sep. 6, 1999, the entire disclosure of which is incorporated herein by reference.

BACKGROUND OF THE INVENTION

1. Technical Field of the Invention

The present invention relates to a method and an apparatus for manufacturing a highly airtight, ceramic-based composite member.

2. Prior Art

The thrust chamber of a rocket engine using a propellant such as $NTO/N_2 H_4$ and NTO/MMH is required to be capable of operating at a high temperature that provides higher engine performance. For this purpose, niobium alloys with a coating that can operate at a temperature of about 1,500° C. have been used conventionally as the chamber material for many rocket engines. However, these materials have such defects as high density, heavy weight, low strength at a high temperature, and short life of coating.

On the other hand, ceramics can resist heat, but are brittle, therefore the ceramic matrix composite (CMC) was developed by reinforcing ceramics with ceramic fibers. In other words, the ceramic matrix composite (CMC) is made of ceramic fibers and ceramic matrix. Normally, a CMC is represented according to its constituents, that is, ceramic fibers/ceramic matrix (for example, SiC/SiC when both constituents are SiC).

A CMC is light in weight and can operate with a high strength at a high temperature, so this material can possibly be applied for the thrust chamber of a rocket engine, as described above, as well as a fuel piping at a high-temperature portions,.turbine blades, combustor, and component parts of after-burner of a jet engine, etc.

However, conventional CMCs were problematic in that airtightness could not be retained and resistance to a heat shock was poor. More explicitly, with a conventional CMC, ceramic fibers were formed into a predetermined shape, and a matrix was created in gaps between fibers by the so-called CVI (Chemical Vapor Infiltration) process, and to completely fill gaps between fibers with the matrix produced in this CVI process, an impractically long time (for instance, more than one year) was required, which was very difficult.

Also, to increase the airtightness of CMC itself, the PIP (Polymer Impregnate and Pyrolysis Method) process in which components made of ceramic fibers are only dipped in a molten material polymer is effective, however, the cycle of impregnating and heating must be repeated many times (for instance, more than 40 times), so efficiency is poor.

In addition, U.S. Pat. No. 05,632,320 disclosed a RTM method (Resin Transfer Molding Method) which is one of pressurized infiltration processes used in PMC (Polymer Matrix Composite) for Polymer matrix infiltration. However the method needs some huge apparatuses such as dies.

SUMMARY OF THE INVENTION

The present invention was developed to solve the above-mentioned problems. That is, an object of the invention is to provide a method and an apparatus for manufacturing a ceramic-based composite member that can increase airtightness and can be applied to practical thrust chambers etc., within a short time.

The method and the apparatus for manufacturing a ceramic-based composite member according to the present invention are configured with (a) a CVI infiltration process for forming an SiC matrix phase on the surface of a shaped fiber fabric, (b) a pressurized infiltration process for pressurizing an organic silicon polymer in a pressurizing direction of the fiber fabric during practical use of the fabric and infiltrating the organic silicon polymer into gaps in the aforementioned matrix phase, and (c) a process for heating the fabric at a high temperature.

The method of the present invention is characterized in that after an SiC matrix phase is produced on the surface of a fiber fabric, the fabric is processed in a pressurized infiltration process. The SiC matrix phase can be created by, for example, a CVI process, as a crackless, dense matrix formed around ceramic fibers. Next, an organic silicon polymer is pressurized in the direction of practical operating pressure of the fiber fabric and pressure-infiltrated through a PIP process, thereby the matrix is formed preferentially in gaps in the matrix phase, gaps after the CVI process are filled, and airtightness of the member can be increased.

Because there are microscopic cracks in the matrix created by the PIP process, bonding forces between ceramic fibers are weak. Therefore, as disclosed in the Japanese patent application No. 019416/1999 (unpublished), as the member is subjected to the PIP process in addition to the CVI process, the modulus of elasticity can be reduced more than that of a conventional CMC produced only by the CVI process, so thermal stresses are reduced and resistance to thermal shock can be greatly improved, as verified through experiments.

According to preferred embodiments of the present invention, the member is maintained for a predetermined time at such a pressure that the organic silicon polymer leaks through gaps in the matrix phase during the aforementioned pressurized infiltration process; next, the member is subjected to a heating process, and furthermore, these pressurized infiltration process and heating process are cyclically applied until satisfactory airtightness of the member is achieved.

In this way, a matrix is formed preferentially in gaps penetrating the composite member, and airtightness can be increased in a short period.

The above-mentioned pressurized infiltration process should preferably be carried out after the matrix is infiltrated by CVI to prevent oxidation, however, the process can be applied at any time provided the interface coating has already been completed.

The present invention offers an apparatus for manufacturing a ceramic-based composite member, provided with holding device (12) for holding a fiber fabric (11) with an SiC matrix phase formed on its surface, airtightly, pressurizing feeder (14) that pressurizes an organic silicon polymer (8) in the direction of applying pressure during use of the fiber fabric and feeds the polymer, and degassing device (16) that removes part of the polymer containing gas bubbles from the organic silicon polymer fed.

In this configuration according to the invention, the fiber fabric (11) with the SiC matrix phase formed on the surface using holding device (12) is kept water-tight, and the organic silicon polymer (8) is pressurized in the direction of pressurizing the fiber fabric during use, and is fed, therefore, by adjusting the pressure the organic silicon polymer can be fed into the fiber fabric at a substantially uniform pressure. In addition, because the organic silicon polymer can be pressurized in the direction of the operating pressure of the fabric and infiltrated into the fabric under pressure, the matrix is created preferentially in gaps in the matrix phase, so that gaps remaining after CVI and PIP processes can be filled, thus the airtightness of the fabric can be increased. Furthermore, degassing device (16) can remove the part of the organic silicon polymer that contains a lot of gas bubbles, and as a result, the uniform organic silicon polymer without bubbles contained can be fed preferentially into gaps in the matrix phase, and a highly airtight matrix can be produced.

Other objects and advantages of the present invention are revealed in the following description referring to the attached drawings.

DESCRIPTION OF PREFERRED EMBODIMENTS

Figure 1:
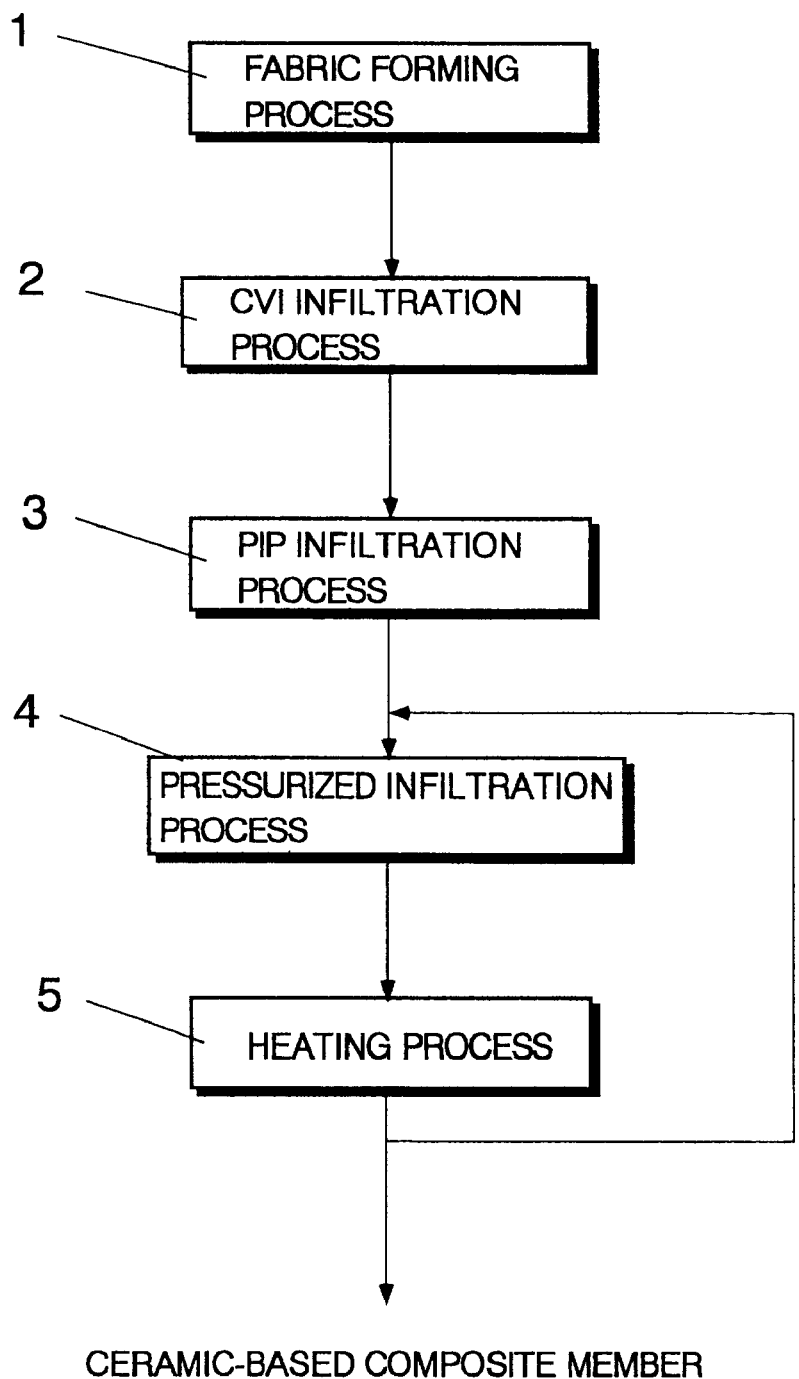
FIG. 1 is a flow chart showing the method for manufacturing a ceramic-based composite member according to the present invention.

Preferred embodiments of the present invention are described as follows referring to the drawings.

FIG. 1 is a flow chart showing the method for manufacturing a ceramic-based composite member according to the invention. The method of the present invention is configured with formation process 1, CVI infiltration process 2, PIP infiltration process 3, pressurized infiltration process 4, medium-temperature heating process 5, and high-temperature heating process 6.

In formation process 1, a fiber fabric with a predetermined shape is formed using SiC fibers. Preferred shapes after forming are three-dimensional and must be suitable for the thrust chamber of a rocket engine, fuel piping at a high-temperature portion, a turbine blade, a combustor, an afterburner component, etc.

CVI infiltration process 2 is a process for CVI processing in which an SiC matrix phase is created in a reduced-pressure environment on the surface of the fiber fabric formed. The CVI processing is configured with an interface CVI process and an SiC matrix CVI process. In the interface CVI process, the fiber fabric formed is coated with carbon (preferably graphite carbon), BN, etc. Preferred thickness of the coating is from 0.1 to 1.0 $\mu$m, approximately. Such a coating phase separates ceramic fibers from the matrix and enhances the toughness of the fibers, as disclosed in the unexamined Japanese patent publication No. 12671/1988.

The SiC matrix CVI process is a process in which work is processed by the so-called CVI method (Chemical Vapor Infiltration); a fabric fixed in an oven using dedicated jigs is heated, and under reduced pressure, methyltrichlorosilane, for example, is introduced and SiC is synthesized. This process is repeated on demand, so that the volumetric ratio of a matrix synthesized by the CVI processing becomes about 5% or more, up to about 80%.

PIP infiltration process 3 is divided into an infiltration process for infiltrating an organic silicon polymer into gaps in the matrix phase formed in CVI infiltration process 2, as a base material, and a subsequent heating process. The filtration and heating processes are repeated if required.

Pressurized infiltration process 4 is a process in which the organic silicon polymer is pressurized in the direction of operating pressure during use to infiltrate the polymer into gaps in the aforementioned matrix phase, that is, a type of PIP infiltration. In pressurized infiltration process 4, a pressure at which the organic silicon polymer leaks slightly through gaps in the matrix phase, is maintained for a predetermined time. The predetermined time is for example 2 minute or 5 minute.

The organic silicon polymer used in pressurized infiltration process 4 should preferably be chosen from among polycarbosilane solution, polyvinylsilane, polymetallocarbosilane, etc. or a mixture of any of these and SiC powder. By virtue of pressurized infiltration process 4 for infiltrating with any of these organic silicon polymers and heating, a matrix with microscopic cracks can be quickly produced.

In heating process 5, work is fired at a temperature close to the operating temperature (for instance, about from 1,000 to 1,400° C.) for a predetermined time (for example, one hour or more). Pressurized infiltration process 4 and heating process 5 are repeated until satisfactory airtightness is achieved.

Figure 2:
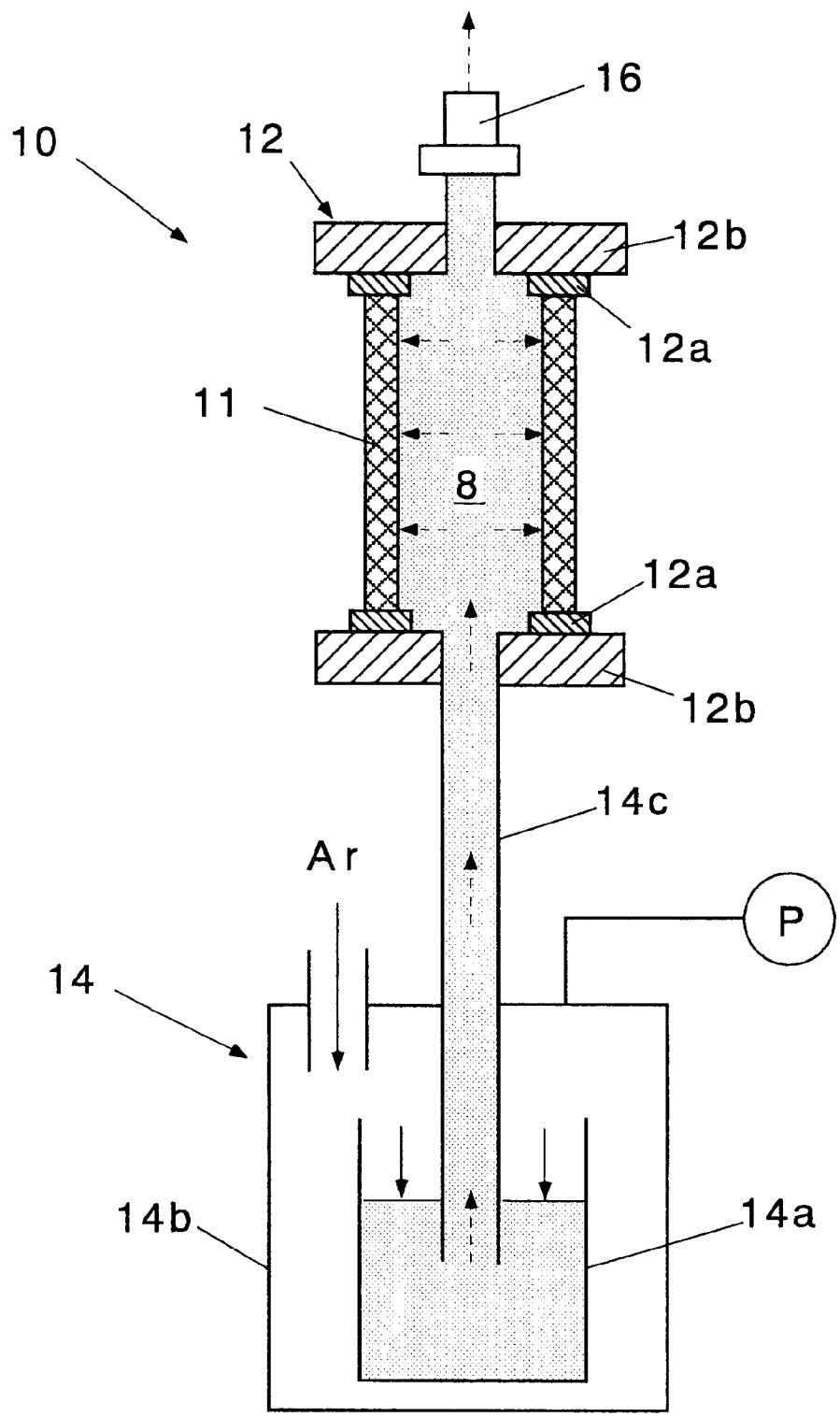
FIG. 2 is one general configuration view of the apparatus for manufacturing a ceramic-based composite member according to the invention.
Figure 3:
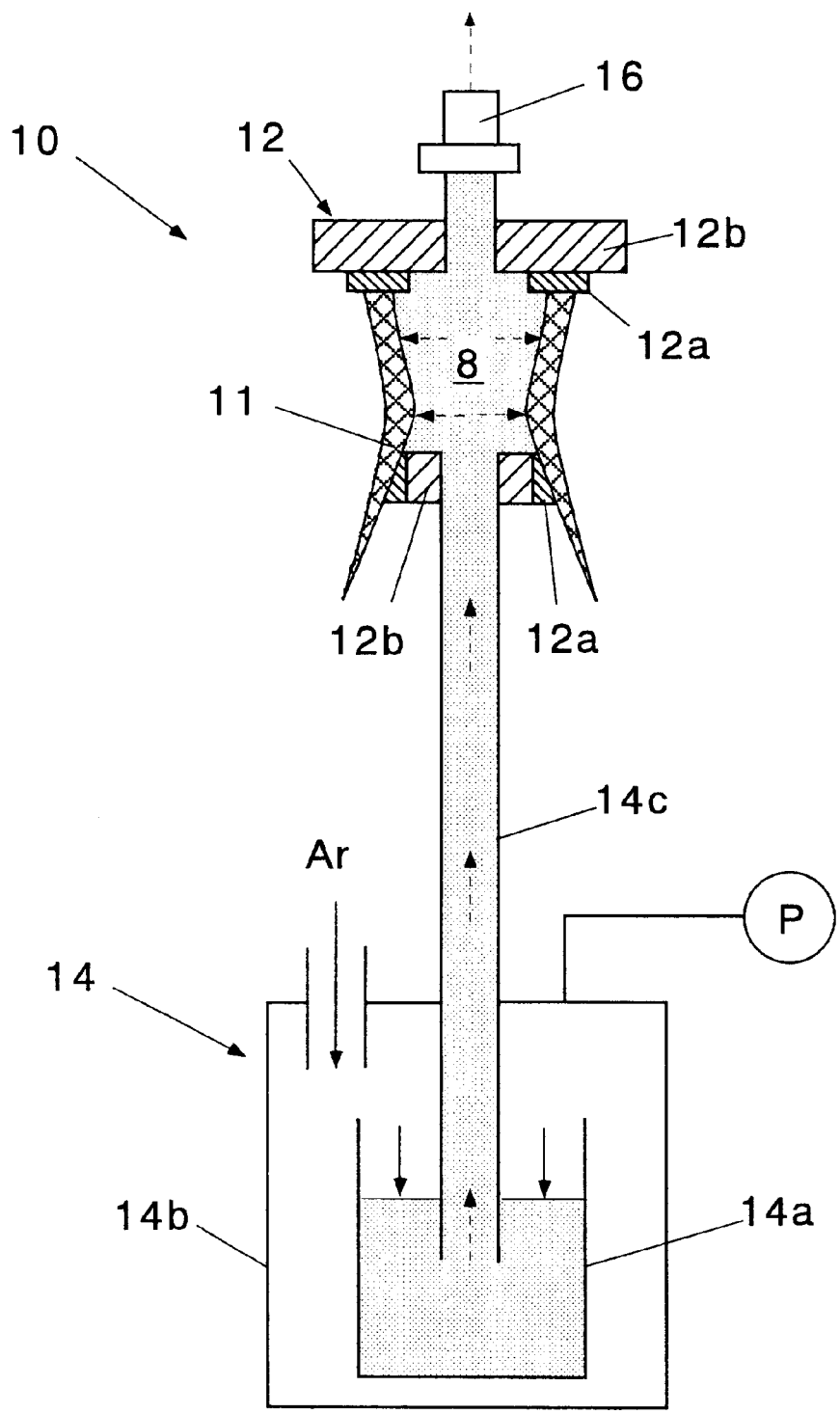
FIG. 3 is another general configuration view of the apparatus for manufacturing a ceramic-based composite member according to the invention.
Figure 4:
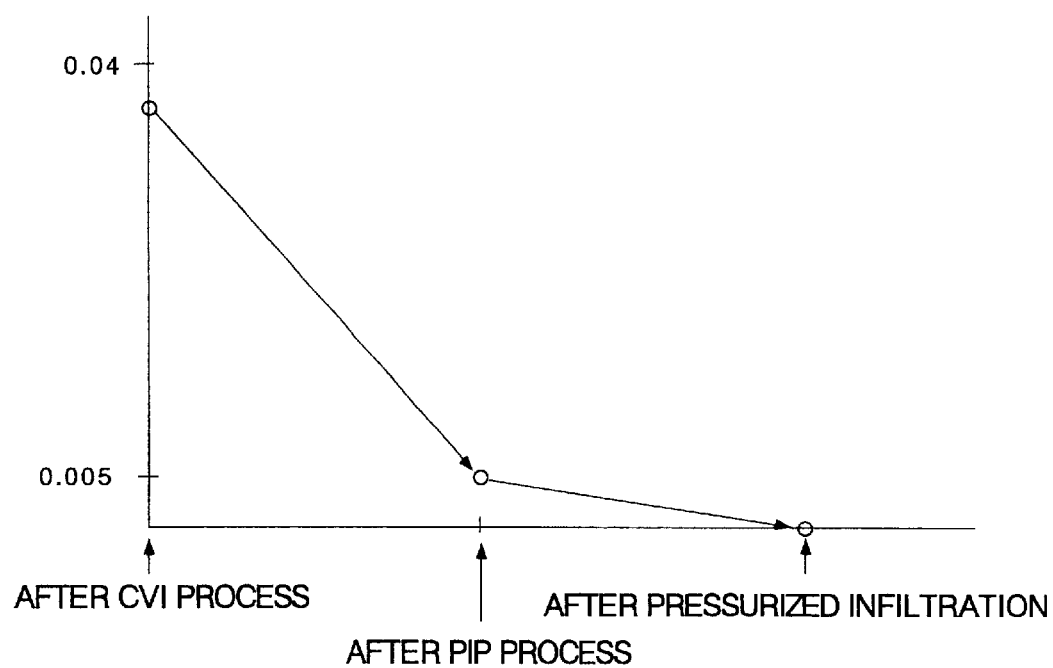
FIG. 4 shows the results of a leakage test with CMC according to the present invention.

FIG. 2 shows one general configuration of the apparatus for manufacturing a ceramic-based composite member according to the present invention. FIG. 3 is another general configuration view of the apparatus for manufacturing a ceramic-based composite member according to the invention. As shown in FIGS. 2 and 3, apparatus 10 for manufacturing a ceramic-based composite member according to the invention is provided with holding device 12, pressurizing feeder 14, and degassing device 16.

Holding device 12 water-tightly holds fiber fabric 11 with a SiC matrix phase formed on the surface. More explicitly, in this example, fiber fabric 11 is a hollow cylindrical member whose openings at both ends (upper and lower ends) are sandwiched between upper and lower support members 12b via sealing rubbers 12a, which are resistant to solutions, so that organic silicon polymer 8 does not leak from both ends. A holding pressure is set so as not to damage fiber fabric 11.

In addition, as shown in FIG. 3, if one end of fiber fabric can not be sandwiched between upper and lower support members due to its thickness or shape, the inner face of the fiber fabric may be used for holding.

Pressurizing feeder 14 is composed of solution vessel 14a containing organic silicon polymer 8, airtight vessel 14b that airtightly encloses solution vessel 14a, feeding tube 14c that leads the organic silicon polymer 8 in solution vessel 14a towards the inside of fiber fabric 11, etc.; the interior of airtight vessel 14b is pressurized with a pressurizing medium gas (Ar, $N_2$, etc.), and organic silicon polymer 8 in solution vessel 14a is pumped up and fed into fiber fabric 11.

Degassing device 16 is an opening/closing valve installed on upper holding member 12b in this example; the valve is closed after part of the organic silicon polymer which contains a lot of gas bubbles, is supplied. However, the present invention is not limited to the configuration in FIGS. 2 and 3, instead the entire setup can be arranged horizontally or upside down.

According to manufacturing apparatus 10 in FIGS. 2 and 3, fiber fabric 11 with an SiC matrix phase created on the surface is held in a water-tight condition by means of holding device 12, and organic silicon polymer 8 is pressurized by the pressure medium gas in the direction that the operating pressure of the fiber fabric is applied to the fabric, and fed into the fabric, therefore, by adjusting the pressure of the pressurizing medium gas, the organic silicon polymer can be supplied into the fiber fabric at a substantially uniform pressure. Moreover, because the organic silicon polymer can be pressurized in the direction of pressurizing during use and infiltrated under pressure, the matrix is formed preferentially into gaps in the matrix phase in the preferred direction for airtightness, gaps after CVI processing are filled, and airtightness can be increased efficiently. In addition, degassing device 16 can remove part of the organic silicon polymer formed on the surface of the polymer with a large amount of gas bubbles, the uniform organic silicon polymer without bubbles can be supplied preferentially into gaps in the matrix phase, thereby a highly airtight matrix can be created.

In addition, other pressurizing means such as piston can be replaced with the pressurizing medium gas.

Embodiments

Embodiments of the present invention are described below.

1. Method for Manufacturing Chamber

SiC/SiC chambers were manufactured according to the manufacturing method shown in FIG. 1. Tyranno Lox-M fibers supplied from Ube Industries, Ltd. were used as SiC fibers for the chamber. The fibers were braided on a mandrel, and SiC matrix was infiltrated. To infiltrate the matrix, CVI infiltration process 2, ordinary PIP treatment process 3, and above-mentioned pressurized infiltration process 4 were combined.

2. Leakage Test

A leakage test was performed at 0.7 MPa. A chamber was submerged in water, pressurized with $N_2$ gas, and gas passed through the chamber was collected and measured to determine the leakage rate. A seal was provided between the chamber and the chamber throat.

FIG. 3 shows results of the leakage test. Even after work was CVI-processed in CVI infiltration process 2 for about one month, there were voids at about 20% of the total volume, and total measured leakage rate corresponded to a hole of about 0.04 mm$^2$ in sectional area. Although this rate is satisfactorily small as CMC, the rate is excessive as a thrust chamber, fuel piping, etc. that require higher airtightness.

Next, the work was processed in ordinary PIP treatment process 3, which included heating, for about 20 cycles. As a result, the leakage rate decreased to about one-seventh or less, reaching a practically acceptable level. A processing period of about 1.5 months was required for these cycles in PIP treatment process 3.

Next, the aforementioned pressurized infiltration process 4 was repeated three times, and as a result, leakage rate became absolutely null. The time required for this processing was about one week.

3. High-pressure Test

Using a pressurizing water medium, chambers were tested at a high pressure of 4.5 MPa. The sealing method was the same as for the leakage test.

For the high-pressure test, a test pressure of 3 MPa was maintained for 10 minutes, and the work was tested by a pressurizing profile with a maximum pressure of 4.5 MPa. As a result, neither leakage, deformation, nor any other damage was acknowledged.

4. Methods of Combustion Test

A combustion test was carried out using rocket test equipment to confirm the resistance of the work tested to heat and acids under combustion conditions, using a propellant of $NTO/N_2H_4$. In this test, two jetting membrane cooling ratios of 26% and 9% were used.

As a result of four cycles of combustion tests carried out, the longest operating time was 22 seconds. The maximum measured temperature of the chamber wall was 1,424° C.

The method of the present invention is characterized as described above, in that after an SiC matrix phase is formed on the surface of a fiber fabric, the fabric is subjected to a pressurized infiltration process. The SiC matrix phase can be created by, for instance, a CVI process; a dense matrix free from cracks is formed around ceramic fibers. Next, the matrix is produced preferentially in gaps in the matrix phase by pressurizing an organic silicon polymer in the direction of applying pressure during use and infiltrating by a PIP process, thereby gaps after the CVI process are filled, and airtightness is increased.

Furthermore, the apparatus according to the present invention maintains fiber fabric 11 in a water-tight condition with the SiC matrix phase formed on the surface of the fabric, using holding device 12, and pressurizing feeder 14 pressurizes organic silicon polymer 8 in the direction in which operating pressure is applied during use of the fiber fabric, and feeds the polymer, therefore, by adjusting the pressure of the gas, the organic silicon polymer can be supplied to the fiber fabric at a substantially uniform pressure.

In addition, the organic silicon polymer can be pressurized and infiltrated in the direction operating pressure is applied during use, so the matrix is formed in gaps in the matrix phase, so that gaps after the CVI process can be filled and airtightness of the fabric can be increased. In addition, degassing device 16 can remove a surface portion of the organic silicon polymer, with a lot of gas bubbles, consequently bubble-free, uniform organic silicon polymer can be fed preferentially into gaps in the matrix phase, thus a highly airtight matrix can be produced.

Hence, the method and the apparatus for manufacturing a ceramic-based composite member according to the present invention can improve the airtightness of the member within a short time of manufacturing, to make the member practically applicable to thrust chambers etc., as an excellent effect.

Although the present invention is described referring to several preferred embodiments, the scope of rights covered by the present invention can be understood not to be limited only to these embodiments. Conversely, the scope of rights according to the present invention include all modifications, amendments, and equivalent entities covered by the range of the attached claims.

What is claimed is:

1. A method for manufacturing a ceramic-based hollow composite member, comprising (a) a CVI infiltration process including forming an SiC matrix phase on a surface of a hollow formed fiber fabric, (b) a pressurized infiltration process including pressurizing an organic silicon polymer substantially in a direction from inside the hollow formed fiber fabric, and infiltrating the organic silicon polymer into gaps in the matrix phase, and (c) a heating process including heating the member.

2. In the method for manufacturing a ceramic-based hollow composite member, specified in claim 1, in the pressurized infiltration process, the member is maintained at a pressure such that the organic silicon polymer leaks through gaps in the matrix phase for a predetermined time, and then is subjected to the heating process, and furthermore the pressurized infiltration process and the heating process are repeated until satisfactory airtightness of the member is achieved.

3. A method for manufacturing a ceramic-based hollow composite member comprising the steps of:
  (a) making and shaping a hollow fiber fabric from SiC, wherein the shaped hollow fiber fabric has a surface;
  (b) creating a SiC matrix phase on the surface of the shaped hollow fiber fabric;
  (c) infiltrating a base material organic silicon polymer into gaps in the matrix phase with an infiltration process followed by heating;
  (d) infiltrating a subsequent organic silicon polymer into gaps in the matrix phase with a pressurized infiltration process, wherein the subsequent organic silicon polymer is pressurized substantially in a direction from inside the hollow fiber fabric to infiltrate the subsequent organic silicon polymer into gaps in the matrix phase; and
  (e) heating the shaped hollow fiber fabric after infiltrating with the subsequent organic silicon polymer to produce the ceramic-based composite member.

4. A method for manufacturing a ceramic-based hollow composite member according to claim 3, wherein the SiC matrix phase is created by chemical vapor infiltration.

5. A method for manufacturing a ceramic-based hollow composite member according to claim 3, wherein steps (d) and (e) are repeated until the hollow composite member is airtight.

6. A method for manufacturing a ceramic-based hollow composite member according to claim 3, wherein infiltrating the subsequent organic polymer into gaps in the matrix phase with the pressurized infiltration process of step (d) is performed substantially in the direction of operating pressure during use.

* * * * *